(12) United States Patent
Jong

(10) Patent No.: US 7,023,038 B2
(45) Date of Patent: Apr. 4, 2006

(54) SILICON BARRIER CAPACITOR DEVICE STRUCTURE

(75) Inventor: Fuh-Cheng Jong, No. 19, Lane 6, Alley 377, Park Rd., Tainan City 70414 (TW)

(73) Assignee: Fuh-Cheng Jong, (TW)

( * ) Notice: Subject to any disclaimer, the term of this patent is extended or adjusted under 35 U.S.C. 154(b) by 0 days.

(21) Appl. No.: 10/864,730

(22) Filed: Jun. 8, 2004

(65) Prior Publication Data

US 2005/0269598 A1    Dec. 8, 2005

(51) Int. Cl.
*H01L 27/108* (2006.01)
(52) U.S. Cl. .................... 257/296; 257/300; 257/306; 257/307; 257/308; 257/595; 257/597; 257/924
(58) Field of Classification Search .................... None
See application file for complete search history.

(56) References Cited

U.S. PATENT DOCUMENTS 4,874,716 A * 10/1989 Rao .............................. 438/257
5,037,772 A * 8/1991 McDonald .................. 438/396

FOREIGN PATENT DOCUMENTS

JP            03032053 A  *  2/1991

* cited by examiner

*Primary Examiner*—Andy Huynh
(74) *Attorney, Agent, or Firm*—Perkins Coie LLP

(57) ABSTRACT

The present invention disclosed a silicon barrier capacitor device structure. By applying CVD or PVD technologies to deposit poly-silicon layers as the dielectric of capacitor on the doping region of the wafer, then implant a high-density ($10^{16}$~$10^{21}$/cm$^3$) impurity of the group III or group V elements and oxygen ion or nitrogen ion to the poly-silicon layer. After implantation, deposit a low resistance and high melting point conductor on the poly-silicon layer for the electrode. to form a capacitor structure, or repeat all of the deposition poly-silicon and both of the low resistance and high melting point conductor on the poly-silicon layer more than once. All of the odd electrodes are connected together. The even electrodes and the substrate are connected together, too. At last, apply high temperature furnace annealing to the devices. The grain boundary of the silicon was oxidized by oxygen and nitrogen to form an isolation film to be the insulation film. The impurity of group III or group V will decrease the resistance of the grain.

18 Claims, 3 Drawing Sheets

SILICON BARRIER CAPACITOR DEVICE STRUCTURE

BACKGROUND OF THE INVENTION

1. Field of the Invention

The present invention relates to a silicon barrier capacitor device structure with high capacitance, In particular, the present invention relates to a silicon barrier capacitor device structure in semiconductor integrated circuits, to produce a capacitor with high capacitance, the process is compatible to silicon based process, so that without contaminating the silicon process by the dielectric layer of other high dielectric materials, then avoiding some problem of capacitor processing.

2. Description of the Related Art

The electronic industry has a conflict to repeat the necessary of a capacitor with high capacitance to satisfy the need of product by decreasing the thickness of the dielectric layer of a capacitor, and increasing the area of the capacitor. On the other hand, in order to achieve the requirement of thinner, lighter shorter and smaller, it is continuously decreasing the volume and area of the capacitor. To solve the above problem, the government, the scholar and the researcher, especially the semiconductor industry use their resources and manpower to develop topics related to capacitor, such as DRAM. As the increasing of the bit density, the capacitor may use trench capacitor or wing structures, even by using higher dielectric constant material such as $BaTiO_3$ or other ferroelectrics materials to replace silicon dioxide ($SiO_2$). For decreasing the thickness of dielectric of the capacitor, it cannot breakthrough because of the limits of processing technology and electric field breakdown. For increasing the area of the capacitor, it is conflict to shorter, lighter and smaller, especially when this is applied to the integrated circuit process, increasing the area of a capacitor will increase the cost of the integrated circuits, furthermore, the yield of production of integrated circuits will be low. For trench capacitor or stack (fin) capacitor, the difficulty of processing will decrease the yield and increase the cost of production. For replacing $SiO_2$ by high dielectric materials, the process will not compatible with the mature silicon based process, this not only need to develop new ferroelectric materials, but also the ferroelectric material will become a serious contamination problem of the semiconductor silicon based process.

In the U.S. Pat. No. 2,152,0376 to Roap Rolland R; Butler charles E., constitutes a new area of barrier capacitor. Refer to FIG. 1, FIG. 1 is a prior art, by combining a layer of reduced ceramic $BaTiO_3$ 103 with low resistively and a layer of oxidized ceramic $BaTiO_3$ 102 with high resistively to form a barrier capacitor 100, then deposite a layer of conductive material 104 on the two sides of the dielectric layer to be the electrodes of the capacitor structure. By using the character of the high resistively of the grain boundary 106 and the low resistivity of the grain crystal 105, as an external voltage is applied to the two electrodes 104 and 101, the grain crystal almost without voltage drop due to its low resistivity character, However, the grain boundary 106 with its high resistivity characteristic that most of the voltage drop between the two electrode 104 and 101 will across the grain boundary 106. The equivalent capacitance will be:

$$C = \varepsilon_r \varepsilon_0 \frac{A}{d_c} \quad (1)$$

Where $d_c$ is the thickness of the dielectric between the two electrodes.

A is the area of the dielectric.

$\varepsilon_r \varepsilon_0$ is the dielectric constant.

The microstructure of this barrier layer capacitor 200 is shown in FIG. 2. The theoretic microstructure of the barrier layer capacitor is shown in FIG. 3.

Refer to FIG. 2, the barrier layer dielectric between the upper electrode 204 and the lower electrode 203 is composed by grain crystal 202 and grain boundary 201. In FIG. 2, dc is the thickness of the dielectric between the upper electrode 204 and the lower electrode 203. The idealized structure is shown in FIG. 3, The barrier layer dielectric is idealized to n layers of grain crystal 302 with thickness of dG and grain boundary with thickness $d_i$.

Since the resistance of the grain crystal 202, 302 is much lower than the resistance of the grain boundary 201, 301, most of the voltage drop between electrodes 203, 204 or 303, 304 will appear in the grain boundary 201, 301. Equation (1) will become:

$$C = \varepsilon_{eff} \varepsilon_0 \frac{A}{nd_i} \quad (2)$$

where n means that in the thickness of the dielectric $d_c$ between the two electrode 303, 304 has n dielectric grain crystal 302, that is:

$$n = dc/(di+dg) \quad (3)$$

where d g is the average diameter of the grain crystal 302, d i is the average width of the grain boacndary 301.

Since d g>>d I, generally, d g~103 d i or more, so that the capacitance will increase more than 1000 time as compare to that of the traditional capacitor. However, the dielectric loss of the capacitor made by this method is not small, the Formular for the dielectric loss is:

$$\tan\delta = \frac{1}{\omega RC} = \frac{1}{\omega \rho k \varepsilon_0} \quad (4)$$

$$r = dI \times ri + rg \quad (5)$$

where r g is the resistance of the grain crystal 302, r i is the resistance of the grain boundary 301.

When it is applied to low frequency, the dielectric loss will be so high that it is difficult to accept it, unless the resistance of the grain boundary 301 is intensively made to be very high (otherwise Equation (2) would not true) so that we can obtain a barrier layer capacitor 200 or 300.

OBJECTS OF THE INVENTION

It is therefore an object of the invention to provide a silicon barrier capacitor device structure, implementing the grain boundary of different crystal phase of silicon crystals to form a high resistance grain boundary capacitor, which is used as the dielectric layer of a capacitor with high capacitance, and need not use high dielectric constant materials or very complex structures to form a capacitor with high capacitance.

It is another object of the invention to provide a silicon barrier capacitor device structure by using poly-silicon as the dielectric material of a barrier capacitor, which is compatible with the mature silicon integrated circuit process.

It is yet another object of the invention to provide a silicon barrier capacitor device structure by using poly-silicon as the dielectric material of a barrier capacitor to decrease the volume of a capacitor, and may use as the capacitor of a DRAM or other capacitor.

The present invention make use of the characteristic that the poly-silicon is formed by a lot of silicon single crystals with different crystal phase, the boundary of every different crystal phase forms so call "grain boundary". Due to the current flow between the grain crystal and the grain boundary, the crystal phase of the next grain is different from the crystal phase of the first grain, so that the electron cannot transport fluently. This is why the resistivity of the poly-silicon is much higher than that of the single crystal silicon.

The present invention is a structure and process by utilizing poly silicon as the dielectric material of a barrier capacitor. Another feature of this invention is that it is accomplished by the mature integrated process teclndogy, can be easily manufactured a small volume capacitor device by sub-micron technology, and even apply to the capacitor of a DRAM.

DISCLOSURE OF THE INVENTION

In order to accomplish the above object and other object, and to improve the disadvantage of the prior art, a first aspect of the present invention teaches a silicon barrier capacitor device structure, by using the characteristic of poly-silicon and the grain boundary to form the dielectric layer of a capacitor, comprising: (a) an electrode, forming by high impurity $n^+$ or $p^+$ doping on a silicon wafer; (b) a poly-silicon layer, depositing on said electrode; doping a high concentration of impurity into said poly-silicon layer; also implanting a silicide forming element into said poly-silicon layer; (c) an upper electrode, forming on said poly-silicon layer; wherein said poly-silicon layer is used as the dielectric layer of a capacitor.

A second aspect of the present invention teaches a silicon barrier capacitor device structure, by using the characteristic of poly-silicon and the grain boundary to form the dielectric layer of a capacitor, comprising: (a) an electrode, by doping a silicon wafer to form n+ or p+ region; (b) a plurality of poly-silicon layer, forming on said electrode; doping a high concentration of impurity into said poly-silicon layer; also implanting a silicide forming element into said poly-silicon layer; (c) a plurality of upper electrode, forming on said poly-silicon layer; (d) the odd layer electrodes are connected together, and the even electrodes are connected to said lower electrode; wherein said poly-silicon layer is used as the dielectric layer of a capacitor.

BRIEF DESCRIPTION OF THE DRAWINGS

The foregoing and other advantages of the invention will be more fully understood with reference to the description of the best embodiment and the drawing wherein.

DESCRIPTION OF THE PREFERRED EMBODIMENTS

Figure 1:
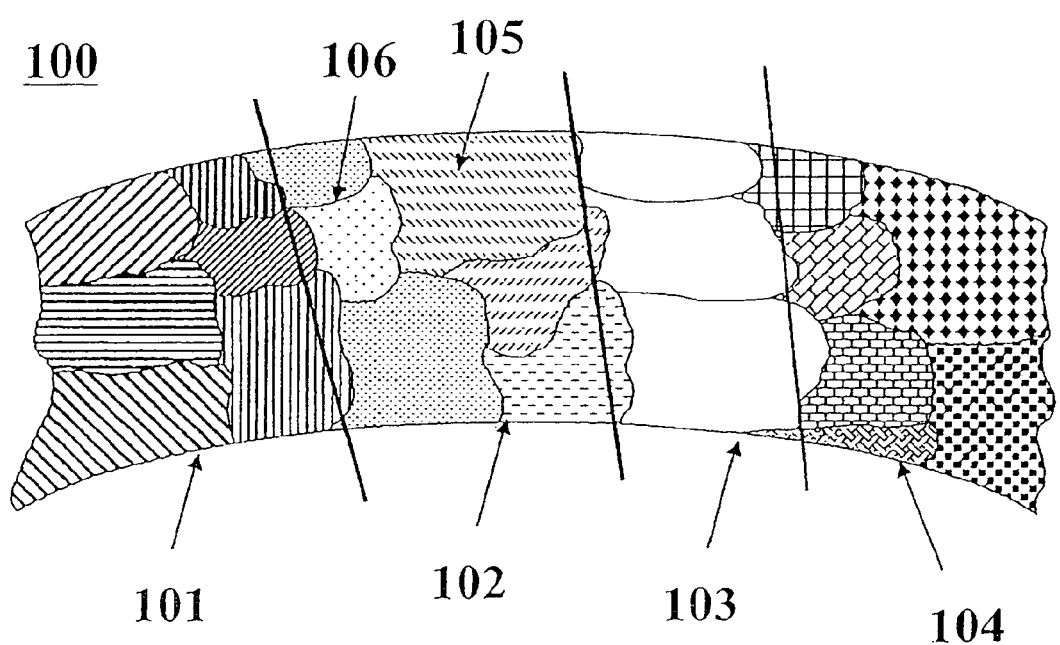
FIG. 1 is a prior art, by combining a layer of reduced ceramic $BaTiO_3$ with low resistively and a layer of oxidized ceramic $BaTiO_3$ with high resistively to form a barrier capacitor.
Figure 2:
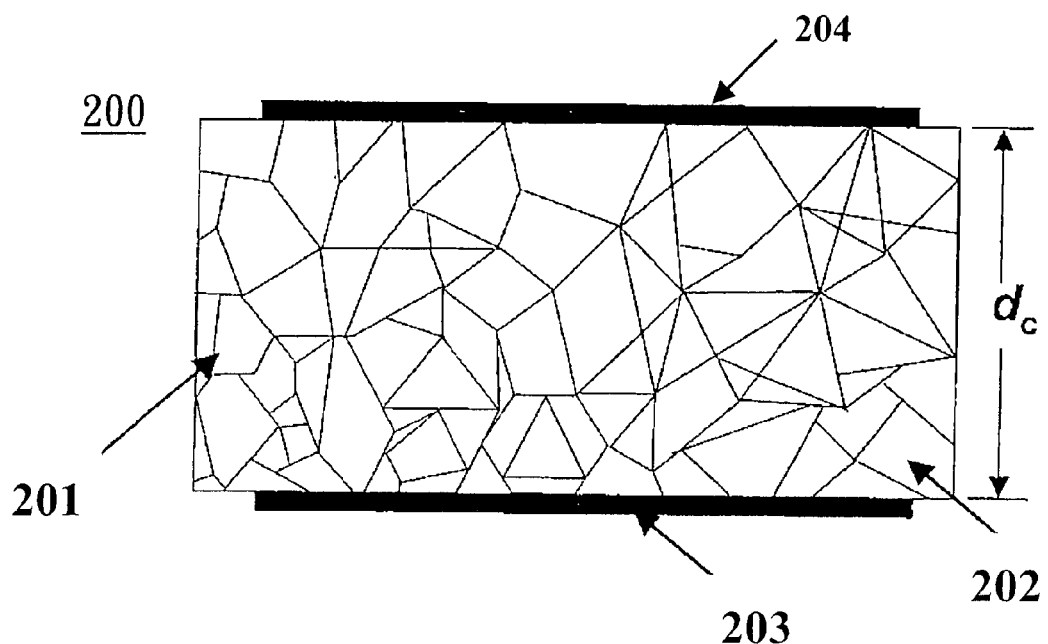
FIG. 2 is a microstructure of a barrier layer capacitor.
Figure 3:
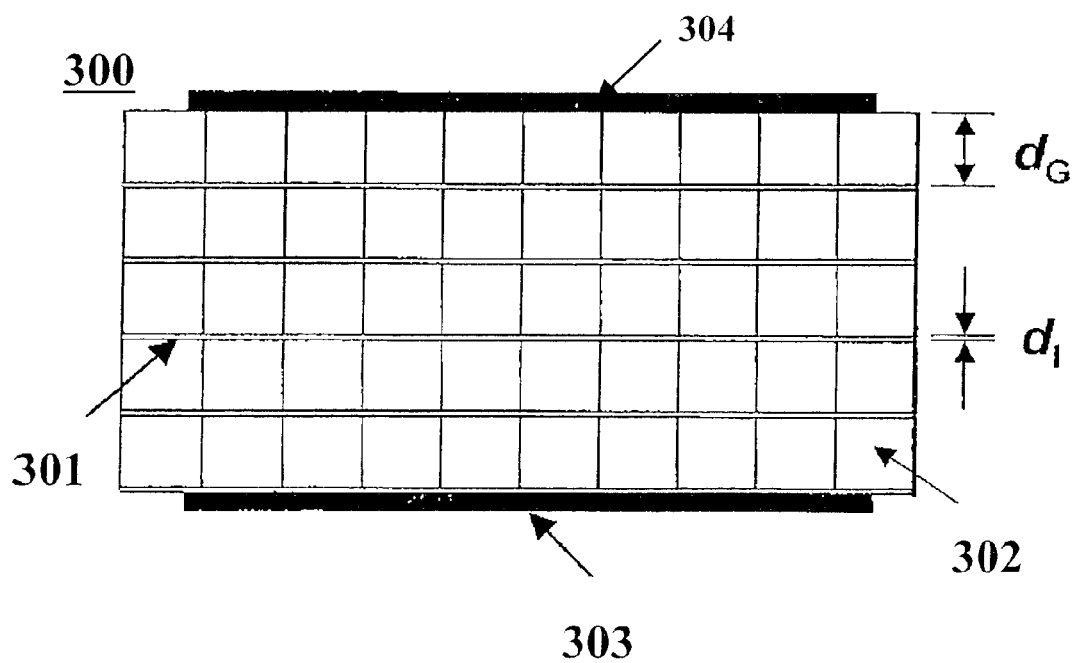
FIG. 3 is a theoretic microstructure of a barrier layer capacitor.
Figure 4:
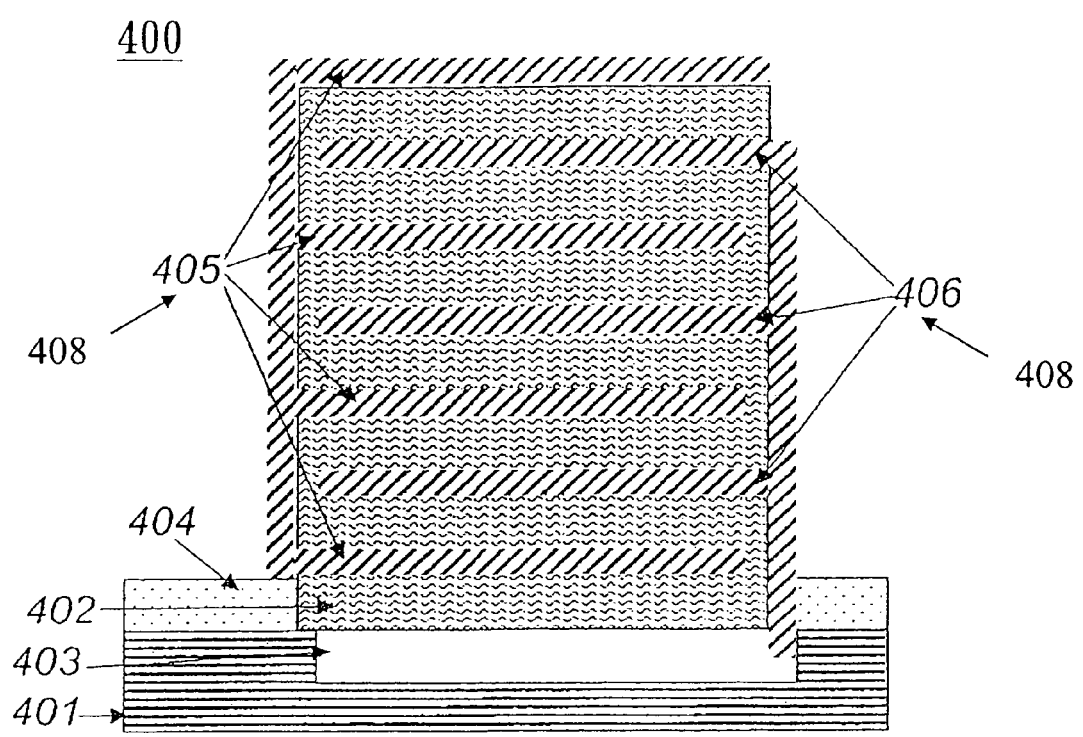
FIG. 4 is a schematic diagram of a multilayer structure of a silicon barrier capacitor in according to one embodiment of the present invention.

Referring to FIG. 4, FIG. 4 is a schematic diagram of a multilayer structure 400 of a silicon ban ier capacitor in according to one embodiment of the present invention. First, doped the wafer 401 so that the intrinsic silicon is transformed into a highly doped impurity region 403 with low resistance, the impurity Such as group III or group V in the periodic table, to transform the electric characteristic of the intrinsic silicon from high resistance into low resistance. The silicon region 403 doped heavily with group III (p-type) or group V (n-type) impurity will be one of the two electrodes (the lower electrode) of the high capacitance device. Next deposits a layer of poly-silicon 402 by CVD or PVD method on the surface of the highly doped silicon region 403. Then by ion implantation, implant a high impurity (for example, $10^{16} \sim 10^{21}$ atom/cm$^3$) of group III or group V element of the periodic table and Oxygen or Nitrogen ion into the poly-silicon 402. Finally, deposited a layer of conductor 408 by CVD or PVD method on the poly-silicon 402, the conductor is a low resistivity and refractory material, which form another electrode (the upper electrode) of the capacitor to form a capacitor structure. The structure is like that of FIG. 2, but replacing the $BaTiO_3$ or other ferroelectric material 202 by poly-silicon, and repeat the steps a multiple of times by depositing poly-silicon on the conductor 408 by CVD or PVD and implant a high impurity of group III or group V element and Oxygen or Nitrogen on poly-silicon 402, then deposit a layer of conductor 408 on the poly-silicon 402 to form the electrode. Basically, the deposition layer of poly-silicon and conductor must be equal. The odd layers of conductors are connected together, and the even layers of conductor 406 are connected to the surface doped impurity region 403, which is the lower electrode of the capacitor. The object is to increase the effective area of the capacitor. Then anneal the device 400 in a furnace to activate the group III or group V element implanted in the poly-silicon, this also forms a silicon dioxide or silicon nitride layer or a combination of $SiO_2$ and $Si_3N_4$ layers of less than 60 Å by oxidizing the grain boundary of the poly-silicon with the implanted oxygen or nitrogen ions to enhance the grain boundary resistance and decrease the leakage current and dielectric loss of the dielectric material (poly silicon).

By repeat depositing dielectric poly-silicon on conductor and then depositing conductor on poly-silicon by CVD or PVD method a plurality of time, an effective large area capacious capacitor can be obtained to increase its capacitance.

As descript above, the high impurity group III or group V element in the periodic table and oxygen or nitrogen is implanted into the poly-silicon, after treated with high temperature, this impurities will diffuse into the grain boundary and aggregate in the grain boundary, then reacts with the oxygen to form silicon dioxide, this action would drive out the arsenic or gallium elements from the silicon dioxide into the crystal grain, thus not only the purity and quality of the silicon dioxide layer will increase due to the decreasing of these ions, it also increase the impurity density in the crystal grain, and decrease the resistance of the crystal grain. All of these will meet the requirement of the character of the barrier layer capacitor.

Although specific embodiments of the invention have been disclosed, it will be understood by those having skill in the art that minor changes can be made to the form and details of the specific embodiments disclosed herein, without departing from the spirit and the scope of the invention. The embodiments presented above are for purposes of example only and are not to be taken to limit the scope of the appended claims.

What is claimed is:

1. A silicon barrier capacitor device structure, by using the characteristic of poly-silicon and the grain boundary to form a dielectric layer of a capacitor, comprising:
   (a) an electrode, forming by high impurity n$^+$ or p$^+$ doping on a silicon wafer;
   (b) a poly-silicon layer, depositing on said electrode; doping a high concentration of impurity into said poly-silicon layer; also implanting a silicide forming element into said poly-silicon layer;
   (c) an upper electrode, forming on said poly-silicon layer; wherein said poly-silicon layer is used as the dielectric layer of a capacitor.

2. A silicon barrier capacitor device structure, by using the characteristic of poly-silicon and the grain boundary to form a dielectric layer of a capacitor, comprising:
   (a) a lower electrode, by doping a silicon wafer to form n$^+$ or p$^+$ region;
   (b) a plurality of poly-silicon layer, forming on said electrode; doping a high concentration of impurity into said plurality of poly-silicon layer; also implanting a silicide forming element into said plurality of poly-silicon layer;
   (c) a plurality of upper electrode, forming on said plurality of poly-silicon layer;
   (d) odd layer electrodes are connected together, and even layer electrodes are connected to said lower electrode; wherein said plurality of poly-silicon layer is used as the dielectric layer of a capacitor.

3. A silicon barrier capacitor device structure as recited in claim 1 or 2, wherein said impurity dopant is group III in the periodic table.

4. A silicon barrier capacitor device structure as recited in claim 1 or 2, wherein said impurity dopant is group V in the periodic table.

5. A silicon barrier capacitor device structure as recited in claim 1 or 2, wherein said silicide forming element is oxygen.

6. A silicon barrier capacitor device structure as recited in claim 1 or 2, wherein said silicide forming element is nitrogen.

7. A silicon barrier capacitor device structure as recited in claim 1 or 2, wherein said silicide forming element is oxygen and nitrogen.

8. A silicon barrier capacitor device structure as recited in claim 1 or 2, wherein the implanting concentration of said impurity dopant is between $10^{16}$~$10^{21}$ atom/cm$^3$.

9. A silicon barrier capacitor device structure as recited in claim 5, wherein the implanting concentration of said oxygen is between $10^{16}$~$10^{21}$ atom/cm$^3$.

10. A silicon barrier capacitor device structure as recited in claim 6, wherein the implanting concentration of nitrogen is between $10^{16}$~$10^{21}$ atom/cm$^3$.

11. A silicon barrier capacitor device structure as recited in claim 7, wherein the implanting concentration of oxygen and nitrogen is between $10^{16}$~$10^{21}$ atom/cm$^3$.

12. A silicon barrier capacitor device structure as recited in claim 2, wherein the number of layers of said odd layer electrodes and said even layer electrodes is the same.

13. A silicon barrier capacitor device structure as recited in claim 2, wherein the number of layers of said odd layer conductors and said even layer conductors is at least one layer.

14. A silicon barrier capacitor device structure as recited in claim 1 or 2, wherein said silicide is silicon dioxide.

15. A silicon barrier capacitor device structure as recited in claim 1 or 2, wherein said silicide is silicon nitride.

16. A silicon barrier capacitor device structure as recited in claim 1 or 2, wherein said suicide is silicon dioxide and silicon nitride.

17. A silicon barrier capacitor device structure as recited in claim 1 or 2, wherein the thickness of said silicide is less than 60 Å.

18. A silicon barrier capacitor device structure as recited in claim 5, wherein the thickness of said silicide is less than 60 Å.

* * * * *